United States Patent
Hong et al.

(10) Patent No.: US 11,955,510 B2
(45) Date of Patent: Apr. 9, 2024

(54) HIGH-EFFICIENCY CAPACITOR STRUCTURE

(71) Applicant: SAMSUNG ELECTRONICS CO., LTD., Suwon-si (KR)

(72) Inventors: Hyeokki Hong, Suwon-si (KR); Cheheung Kim, Yongin-si (KR); Sungchan Kang, Hwaseong-si (KR); Yongseop Yoon, Seoul (KR); Choongho Rhee, Anyang-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 2 days.

(21) Appl. No.: 17/671,040

(22) Filed: Feb. 14, 2022

(65) Prior Publication Data
US 2022/0173210 A1  Jun. 2, 2022

Related U.S. Application Data

(62) Division of application No. 16/397,442, filed on Apr. 29, 2019, now abandoned.

(30) Foreign Application Priority Data

Dec. 20, 2018  (KR) .......................... 10-2018-0166408

(51) Int. Cl.
  *H01L 49/02*  (2006.01)
(52) U.S. Cl.
  CPC .............. *H01L 28/86* (2013.01); *H01L 28/91* (2013.01); *H01L 28/60* (2013.01)

(58) Field of Classification Search
  CPC ......... H01L 28/86; H01L 28/87; H01L 28/88; H01L 28/90; H01L 28/91; H01L 28/92; H01L 23/5223
  See application file for complete search history.

(56) References Cited

U.S. PATENT DOCUMENTS

| | | |
|---|---|---|
| 6,690,570 B2 | 2/2004 | Hajimiri et al. |
| 7,956,438 B2 | 6/2011 | Ouinn |
| (Continued) | | |

FOREIGN PATENT DOCUMENTS

| | | |
|---|---|---|
| JP | 2012-509593 A | 4/2012 |
| KR | 10-2018-0054835 A | 5/2018 |

OTHER PUBLICATIONS

Communication dated Dec. 6, 2019 by the European Patent Office in counterpart European Patent Application No. 19174799.7.
(Continued)

*Primary Examiner* — Younes Boulghassoul
*Assistant Examiner* — Quinton A Brasfield
(74) *Attorney, Agent, or Firm* — Sughrue Mion, PLLC

(57) ABSTRACT

A capacitor structure includes at least one first layer and at least one second layer that are alternately stacked. The at least one first layer includes first electrodes and second electrodes alternately arranged in a first direction, and the at least one second layer includes third electrodes and fourth electrodes alternately arranged in a second direction intersecting the first direction, the third electrodes and the fourth electrodes being electrically connected to the first electrodes and the second electrodes. Each of the first electrodes and the second electrodes includes a base portion and branch portions protruding from the base portion, and the third electrodes and the fourth electrodes are arranged side by side to correspond to the branch portions.

4 Claims, 12 Drawing Sheets

(56) References Cited

U.S. PATENT DOCUMENTS

| | | | |
|---|---|---|---|
| 8,970,002 B2 | 3/2015 | Sutardja | |
| 9,177,909 B2 | 11/2015 | Shih | |
| 9,287,209 B2 | 3/2016 | Woo et al. | |
| 9,331,026 B1 | 5/2016 | Watt et al. | |
| 10,026,685 B2 | 6/2018 | Jin et al. | |
| 2004/0036143 A1 | 2/2004 | Hu et al. | |
| 2005/0135042 A1 | 6/2005 | Chiu-Kit Fong et al. | |
| 2008/0079117 A1* | 4/2008 | Baumgartner | H01L 23/5223 |
| | | | 257/532 |
| 2008/0239619 A1 | 10/2008 | Okamoto et al. | |
| 2009/0097186 A1 | 4/2009 | Topaloglu | |
| 2012/0286394 A1 | 11/2012 | Sutardja | |
| 2013/0113077 A1 | 5/2013 | Woo et al. | |
| 2013/0228894 A1* | 9/2013 | Yen | H01L 23/5223 |
| | | | 257/532 |
| 2014/0103490 A1* | 4/2014 | Kumar | H01L 28/86 |
| | | | 257/532 |
| 2015/0084107 A1* | 3/2015 | Li | H01L 29/93 |
| | | | 257/300 |
| 2017/0093362 A1* | 3/2017 | Jin | H01L 23/5223 |
| 2017/0352719 A1 | 12/2017 | Tsai et al. | |
| 2019/0164903 A1* | 5/2019 | Chen | H01L 28/86 |

OTHER PUBLICATIONS

Ershov, M., "MOM capacitor simulation challenges and solutions", 2009, 4 pages total.

Communication dated Aug. 15, 2023 issued by the Japanese Intellectual Property Office in counterpart Japanese Application No. 2019-183192.

* cited by examiner

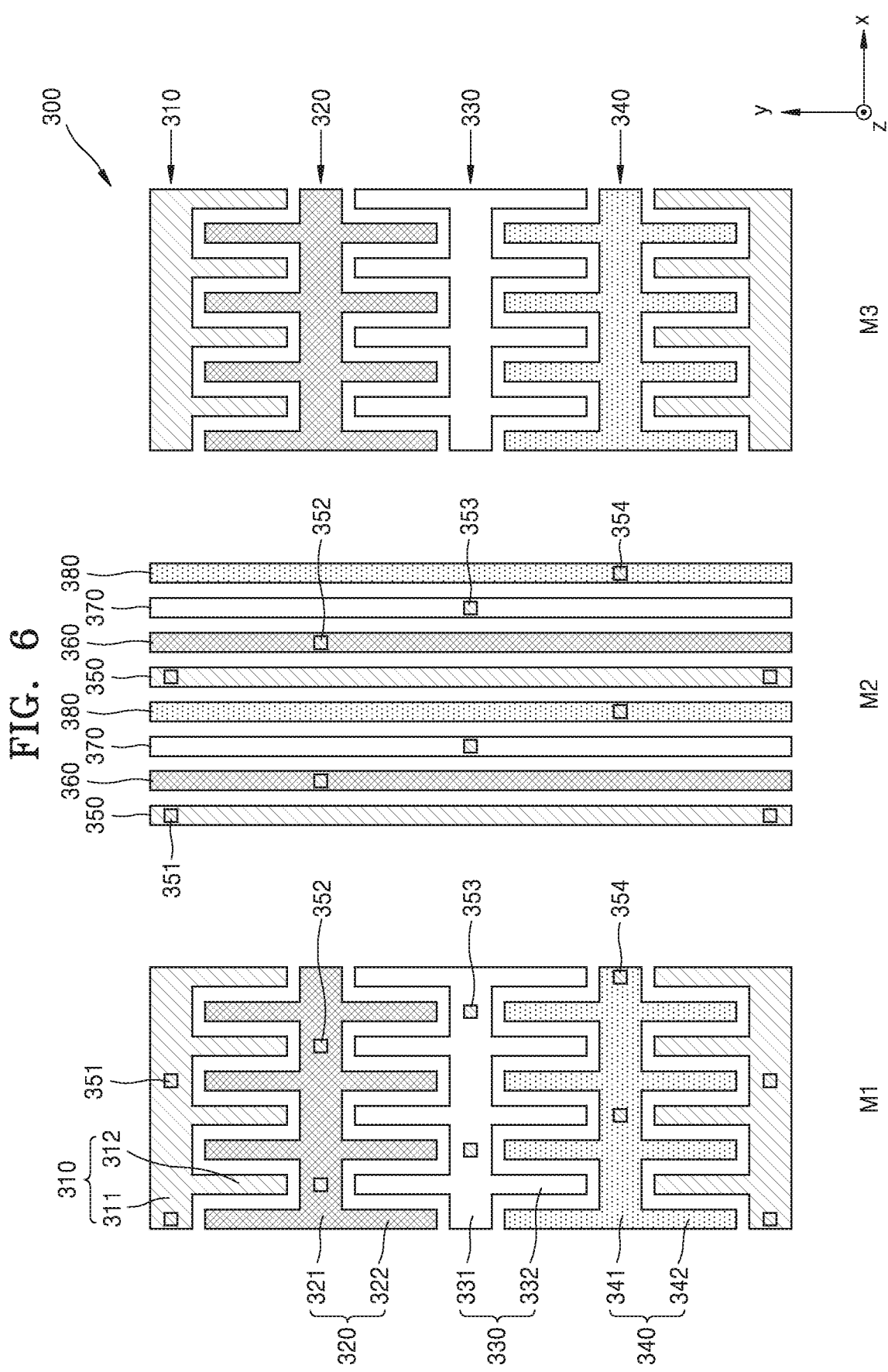

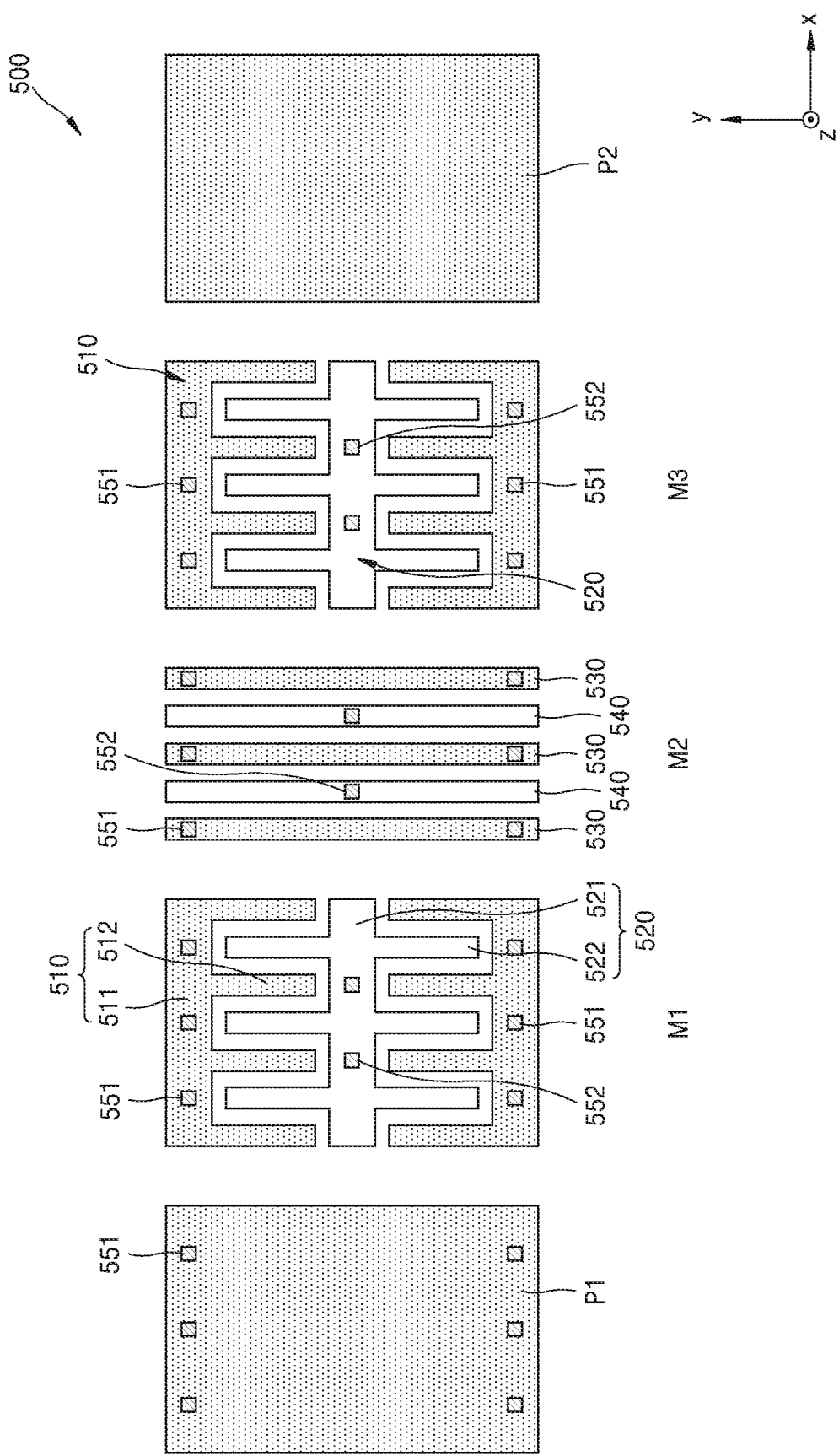

HIGH-EFFICIENCY CAPACITOR STRUCTURE

CROSS-REFERENCE TO RELATED APPLICATION

This is a divisional application of U.S. application Ser. No. 16/397,442 filed Apr. 29, 2019, which claims priority from Korean Patent Application No. 10-2018-0166408, filed on Dec. 20, 2018, in the Korean Intellectual Property Office, the disclosures of which are incorporated herein by reference in their entirety.

BACKGROUND

1. Field

Apparatuses consistent with embodiments relate to capacitor structures, and more particularly, to high-efficiency capacitor structures for realizing a high degree of integration in small areas of integrated circuits.

2. Description of the Related Art

Capacitors are elements of integrated circuits such as sensors, amplifiers, filters, analog-to-digital converters (ADCs), phase-locked loops (PLLs), and power management integrated circuits (PMICs). Such capacitors occupy relatively large areas in integrated circuits, and thus, capacitor structures for realizing high-degree integration are desired.

SUMMARY

According to embodiments, a capacitor structure includes at least one first layer and at least one second layer that are alternately stacked. The at least one first layer includes first electrodes and second electrodes alternately arranged in a first direction, and the at least one second layer includes third electrodes and fourth electrodes alternately arranged in a second direction intersecting the first direction, the third electrodes and the fourth electrodes being electrically connected to the first electrodes and the second electrodes. Each of the first electrodes and the second electrodes includes a base portion and branch portions protruding from the base portion, and the third electrodes and the fourth electrodes are arranged side by side to correspond to the branch portions.

Each of the first electrodes may be capacitively coupled to a respective one of the second electrodes in a horizontal direction of the at least one first layer, and may be capacitively coupled to a respective one of the fourth electrodes in a vertical direction of the at least one first layer.

Each of the second electrodes may be capacitively coupled to a respective one of the first electrodes in a horizontal direction of the at least one first layer, and may be capacitively coupled to a respective one of the third electrodes in a vertical direction of the at least one first layer.

The second direction may be perpendicular to the first direction.

The base portion may extend in the second direction, and the branch portions may protrude from the base portion in the first direction.

The branch portions may be spaced apart from each other and arranged side by side in the second direction.

The branch portions of the first electrode may be arranged between the branch portions of the second electrode.

The third electrodes may be arranged at a plurality of first positions corresponding to the branch portions of the second electrode, and the fourth electrodes may be arranged at a plurality of second positions corresponding to the branch portions of the first electrode.

The capacitor structure may further include at least one first contact element interposed between the first electrodes and the third electrodes, and at least one second contact element interposed between the second electrodes and the fourth electrodes.

The at least one first contact element may be arranged at one or more first positions corresponding to the base portion of each of the first electrodes, and the at least one second contact element may be arranged at one or more second positions corresponding to the base portion of each of the second electrodes.

The at least one first layer may include a plurality of first layers, and the at least one second layer may be interposed between the plurality of first layers.

The first electrode may be disposed on an outer side of the at least one first layer, and the third electrode may be disposed on an outer side of the at least one second layer.

The capacitor structure may further include a first plate electrode and a second plate electrode configured to cover outer sides of the plurality of first layers and electrically connected to the first electrodes.

According to embodiments, there is provided a capacitor structure including at least one first layer and at least one second layer that are alternately stacked. The at least one first layer includes first electrodes arranged in a first direction, the at least one second layer includes second electrodes electrically connected to the first electrodes, each of the first electrodes includes a base portion and branch portions protruding from the base portion, and the second electrodes correspond to the branch portions.

At least one of the first electrodes may not be physically connected to at least one of the second electrodes, and the at least one of the first electrodes may be capacitively coupled to the at least one of the second electrodes.

The second electrodes may be arranged side by side to correspond to the branch portions.

At least one of the first electrodes may not be physically connected to at least one of the second electrodes, and the at least one of the first electrodes may not be capacitively coupled to the at least one of the second electrodes.

The base portion may extend in a second direction perpendicular to the first direction, and the branch portions may protrude from the base portion in the first direction.

The branch portions may be spaced apart from each other and arranged side by side in the second direction.

The capacitor structure may further include at least one contact element interposed between the first electrodes and the second electrodes.

According to embodiments, there is provided a capacitor structure including a first layer, a second layer disposed on the first layer, and a third layer disposed on the second layer. Each of the first layer and the third layer includes first electrodes and second electrodes alternately arranged in a first direction, and each of the first electrodes and the second electrodes includes a base portion and branch portions protruding from the base portion. The second layer includes third electrodes and fourth electrodes alternately arranged in a second direction perpendicular to the first direction, and the third electrodes and the fourth electrodes are arranged to respectively correspond to the branch portions. The capacitor structure further includes one or more first contact elements interposed between the base portion of each of the first electrodes and the third electrodes, and one or more second contact element interposed between the base portion of each of the second electrodes and the fourth electrodes.

Different voltages may be respectively applied to the first electrodes and the second electrodes, and the different voltages may be respectively applied to the third electrodes and the fourth electrodes.

BRIEF DESCRIPTION OF THE DRAWINGS

FIG. 6 is a plan view illustrating a capacitor structure according to another embodiments.

FIG. 8 is a plan view illustrating a capacitor structure according to embodiments.

DETAILED DESCRIPTION

Figure 1:
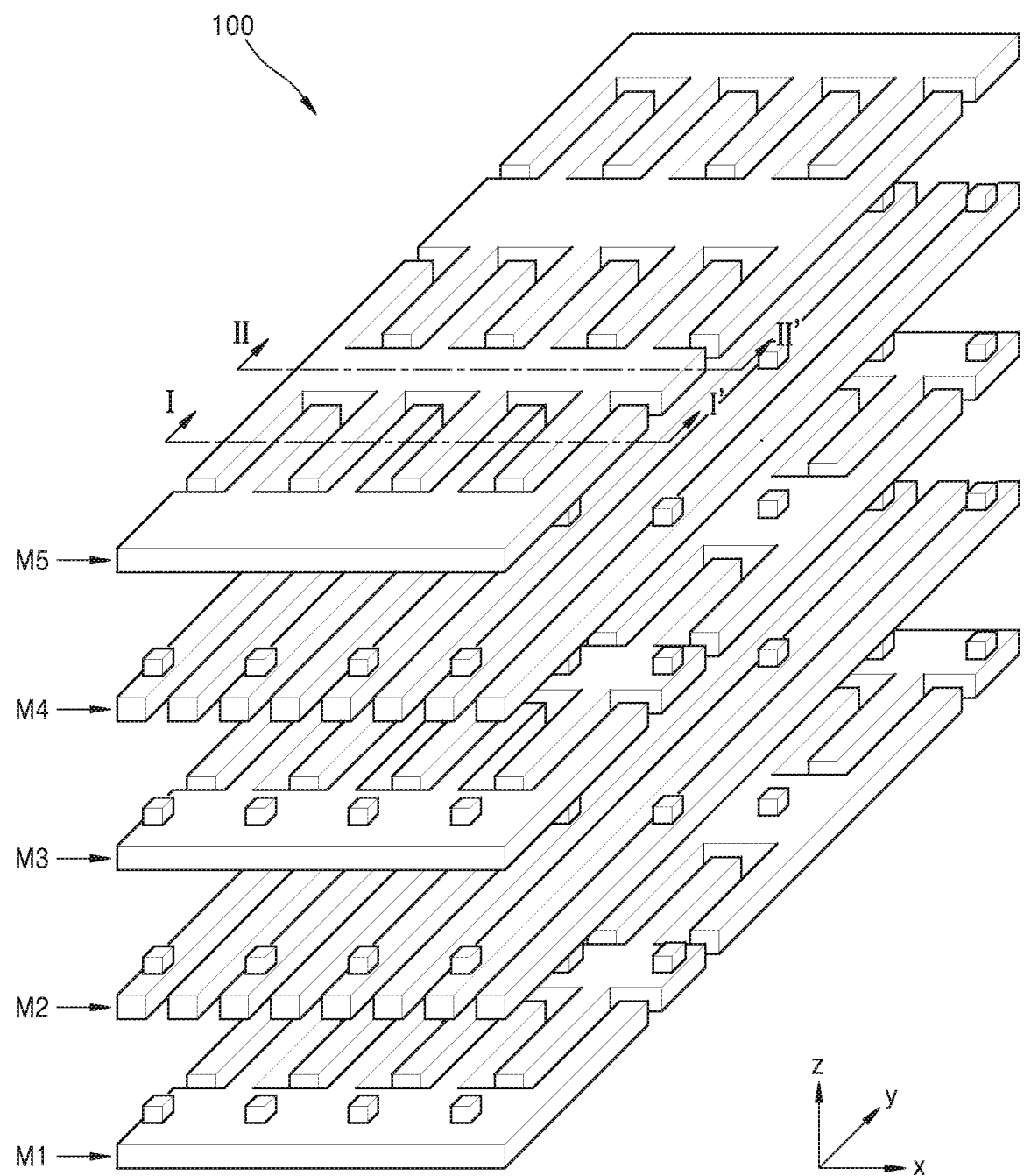
FIG. 1 is an exploded perspective view illustrating a capacitor structure according to embodiments.

Reference will now be made in detail to embodiments, examples of which are illustrated in the accompanying drawings. In the drawings, like reference numerals refer to like elements throughout, and the sizes of elements may be exaggerated for clarity of illustration. In this regard, the present embodiments may have different forms and may not be construed as being limited to the descriptions set forth herein. Accordingly, the embodiments are described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

In the following description, when an element is referred to as being "above" or "on" another element, it may be directly on the other element while making contact with the other element or may be above the other element without making contact with the other element. The terms of a singular form may include plural forms unless otherwise mentioned. It will be further understood that the terms "comprises" and/or "comprising" used herein specify the presence of stated features or elements, but do not preclude the presence or addition of one or more other features or elements.

An element referred to with the definite article or a demonstrative pronoun may be construed as the element or the elements even though it has a singular form. Operations of a method may be performed in appropriate order unless explicitly described in terms of order or described to the contrary. That is, operations are not limited to the order in which the operations are described. Examples or terms are just used herein to describe technical ideas and may not be considered for purposes of limitation unless defined by the claims.

Provided are high-efficiency capacitor structures for realizing a high degree of integration in small areas of integrated circuits.

Figure 2A:
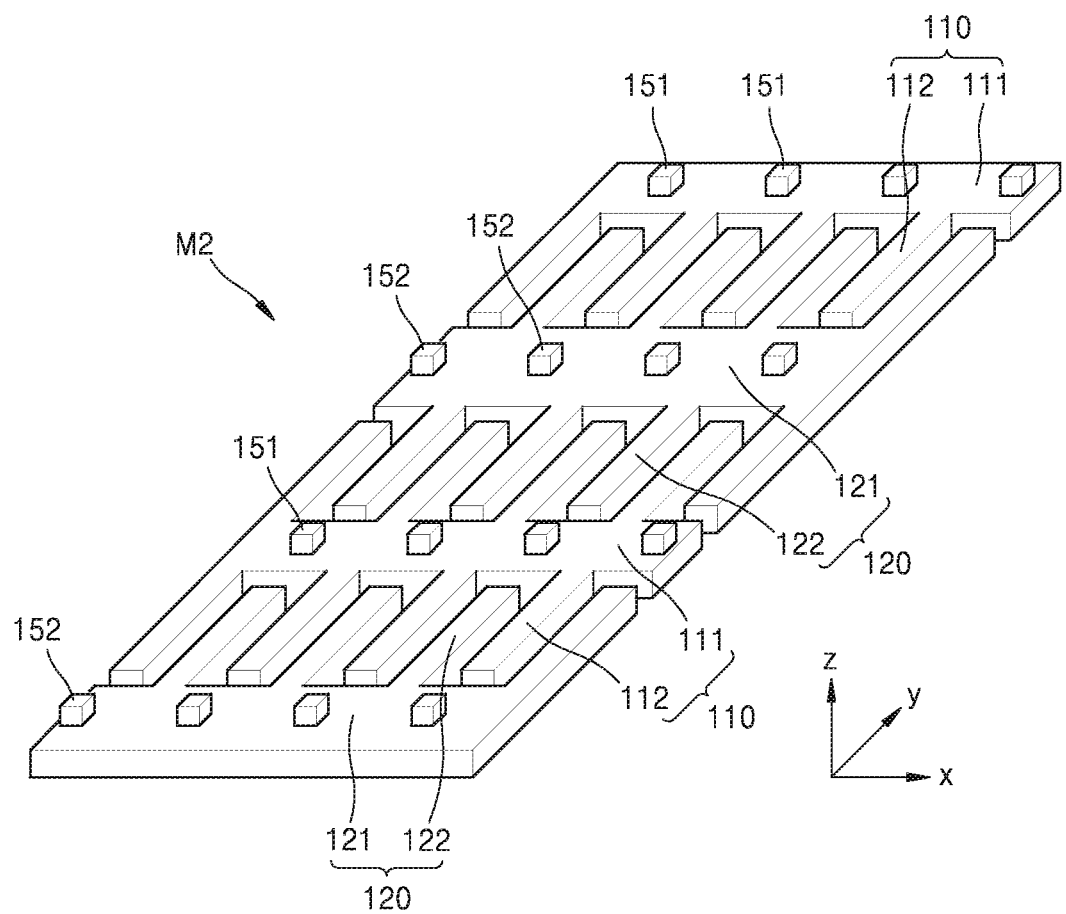
FIGS. 2A and 2B are perspective views illustrating a first layer and a second layer of the capacitor structure shown in FIG. 1.
Figure 2B:
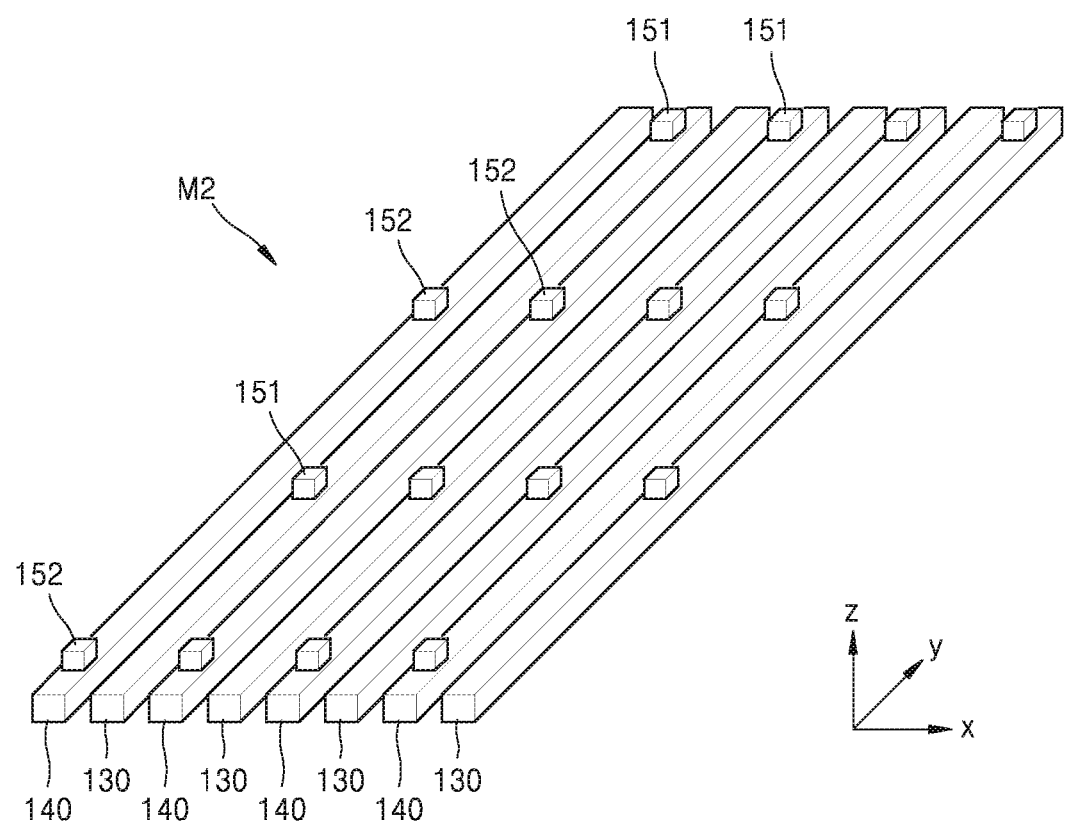
Figure 3A:
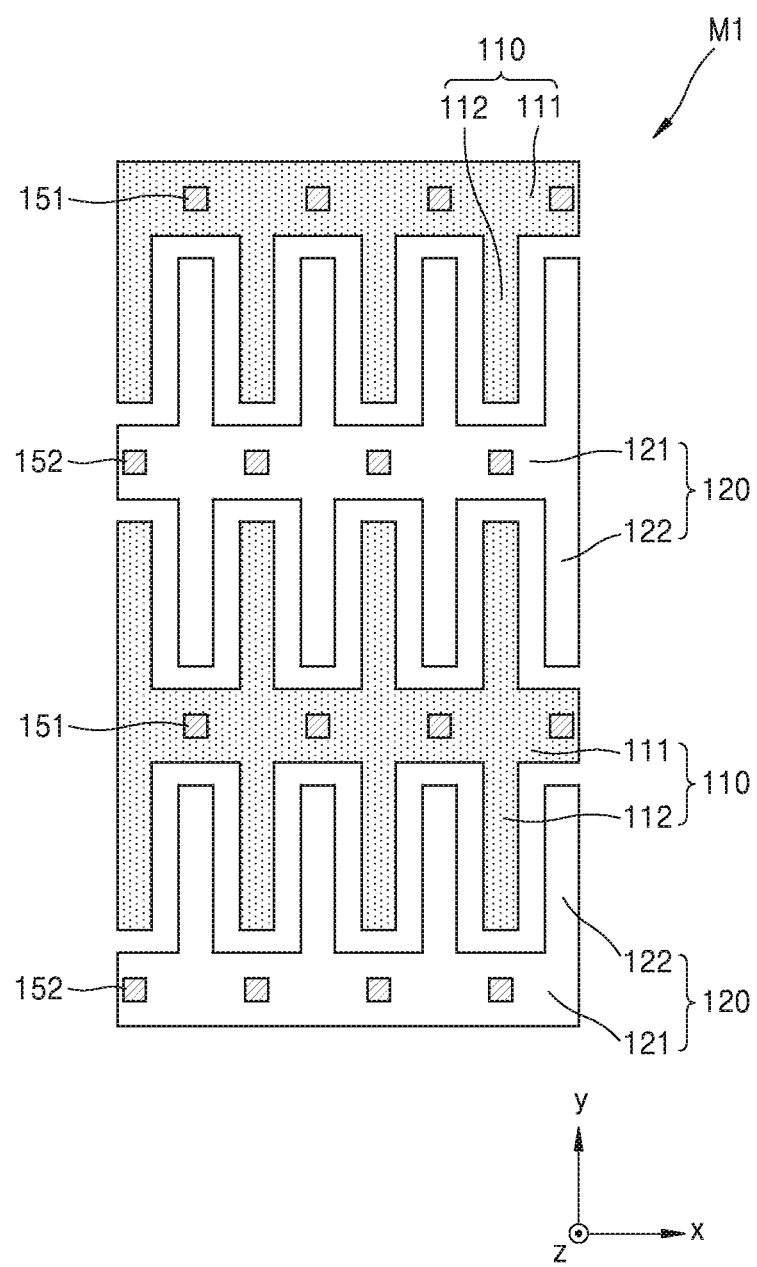
FIGS. 3A and 3B are plan views illustrating the first layer and the second layer of the capacitor structure shown in FIG. 1.
Figure 3B:
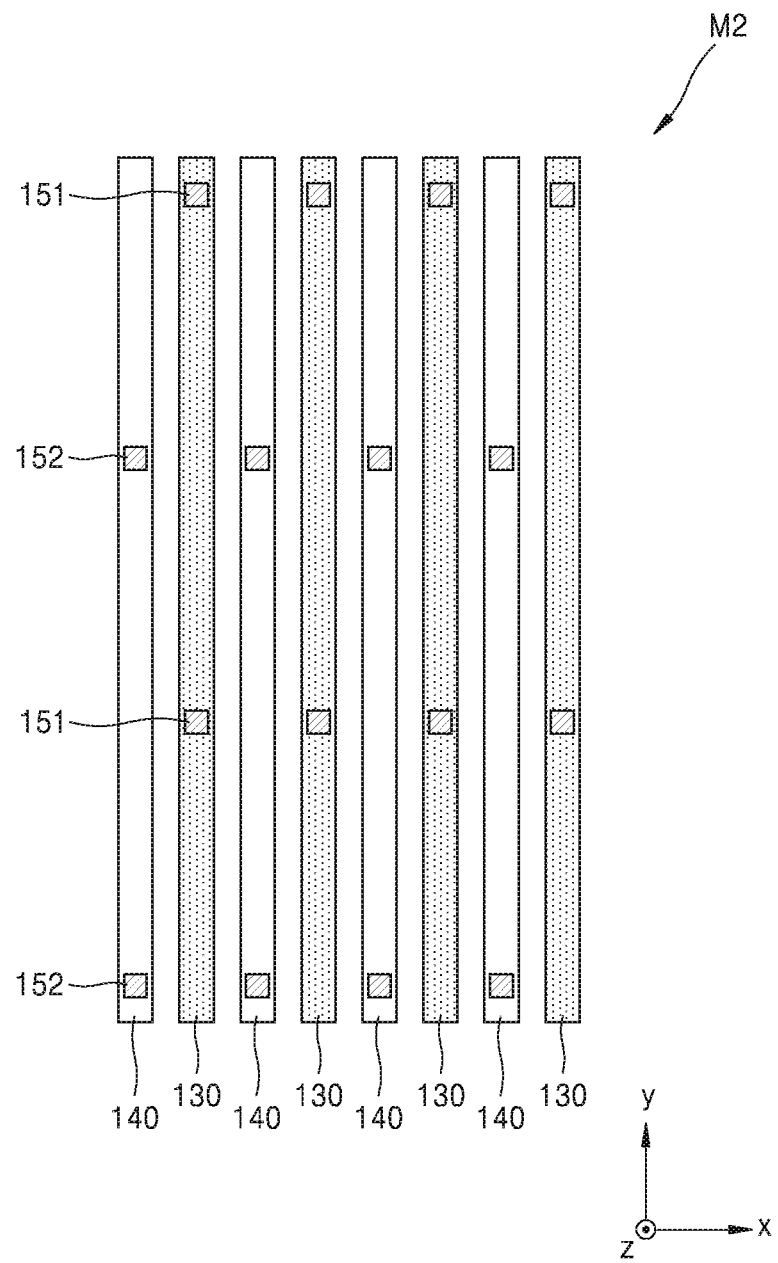

FIG. 1 is an exploded perspective view illustrating a capacitor structure 100 according to embodiments. FIGS. 2A and 2B are perspective views illustrating a first layer M1 and a second layer M2 shown in FIG. 1, and FIGS. 3A and 3B are plan views illustrating the first layer M1 and the second layer M2 shown in FIG. 1.

Referring to FIGS. 1 to 3B, the capacitor structure 100 includes at least one first layer M1 and at least one second layer M2 alternately stacked in a vertical direction (for example, a z-axis direction). In the example shown in FIG. 1, the capacitor structure 100 includes first to fifth layers M1, M2, M3, M4, and M5 that are sequentially stacked in the z-axis direction. Here, the third layer M3 and the fifth layer M5 are identical to the first layer M1, and the fourth layer M4 is identical to the second layer M2. Therefore, in FIG. 1, it may be understood that three first layers M1 and two second layers M2 are alternately stacked in the z-axis direction.

The first layer M1 may include at least one first electrode 110 and at least one second electrode 120 that are alternately arranged in a first direction (for example, a y-axis direction). Different voltages may be applied to the first and second electrodes 110 and 120. FIG. 2A and FIG. 3A illustrate an example in which two first electrodes 110 and two second electrodes 120 are alternately arranged in the first layer M1 in the y-axis direction. However, this is a non-limiting example. That is, the numbers of first and second electrodes 110 and 120 provided in the first layer M1 may be variously selected. The first and second electrodes 110 and 120 may include a metallic material having high conductivity.

Each of the first electrodes 110 may include a base portion 111 and a plurality of branch portions 112 protruding from the base portion 111. The base portion 111 may extend in a second direction (for example, an x-axis direction) perpendicular to the first direction (for example, the y-axis direction), and the plurality of branch portions 112 may protrude from the base portion 111 in the first direction. Here, the plurality of branch portions 112 may be arranged side by side and spaced apart from each other in the second direction.

In a first electrode 110 located on an edge portion of the first layer M1, the plurality of branch portions 112 may protrude from a side of the base portion 111, and in a first electrode 110 located in a center portion of the first layer M1, the plurality of branch portions 112 may protrude from both sides of the base portion 111. FIGS. 2A and 3A illustrate an example in which four branch portions 112 protrude from one side of the base portion 111 of each of the first electrodes 110 in the first direction (for example, the y-axis direction).

Each of the second electrodes 120 may include a base portion 121 and a plurality of branch portions 122 protruding from the base portion 121. The base portion 121 may extend in the second direction perpendicular to the first direction, and the plurality of branch portions 122 may protrude from the base portion 121 in the first direction. Here, the plurality of branch portions 122 may be arranged side by side and spaced apart from each other in the second direction. The plurality of branch portions 122 of the second electrode 120 may be arranged between the branch portions 112 of the first electrode 110.

In a second electrode 120 located on an edge portion of the first layer M1, the plurality of branch portions 122 may protrude from a side of the base portion 121, and in a second electrode 120 located in a center portion of the first layer M1, the plurality of branch portions 122 may protrude from both sides of the base portion 121. FIGS. 2A and 3A illustrate an example in which four branch portions 122 protrude from one side of the base portion 121 of each of the second electrodes 120 in the y-axis direction.

A plurality of contact elements 151 and 152 may be provided on the first layer M1. For example, the plurality of contact elements 151 and 152 may include one or more first contact elements 151 provided on the first electrodes 110 and one or more second contact elements 152 provided on the second electrodes 120.

The first contact elements 151 may electrically connect the first electrodes 110 of the first layer M1 to third electrodes 130 of the second layer M2 and may include a conductive material. The first contact elements 151 may be provided on the base portions 111 of the first electrodes 110. However, this is a non-limiting example. For example, the first contact elements 151 may be provided on the branch portions 112 of the first electrodes 110.

The second contact elements 152 may electrically connect the second electrodes 120 of the first layer M1 to fourth electrodes 140 of the second layer M2 and may include a conductive material. The second contact elements 152 may be provided on the base portions 121 of the second electrodes 120. However, this is a non-limiting example. For example, the second contact elements 152 may be provided on the branch portions 122 of the second electrodes 120.

The second layer M2 may include one or more third electrodes 130 and one or more fourth electrodes 140 that are alternately arranged in the second direction (for example, the x-axis direction). Different voltages may be applied to the third and fourth electrodes 130 and 140. The third electrodes 130 may be electrically connected to the first electrodes 110 through the first contact elements 151 such that the same voltage may be applied to the third electrodes 130 and the first electrodes 110. In addition, the fourth electrodes 140 may be electrically connected to the second electrodes 120 through the second contact elements 152 such that the same voltage may be applied to the fourth electrodes 140 and the second electrodes 120. Therefore, different voltages may be applied to the first and fourth electrodes 110 and 140, and different voltages may be applied to the second and third electrodes 120 and 130.

FIGS. 2B and 3B illustrate an example in which four third electrodes 130 and four fourth electrodes 140 are alternately arranged in the second layer M2 in the x-axis direction. However, this is a non-limiting example. That is, the numbers of third and fourth electrodes 130 and 140 provided in the second layer M2 may be variously selected. The third and fourth electrodes 130 and 140 may include a metallic material having high conductivity. Here, each of the third and fourth electrodes 130 and 140 may have a line shape extending in the first direction (for example, the y-axis direction), and the third and fourth electrodes 130 and 140 having a line shape may be arranged side by side.

The branch portions 112 of the first electrodes 110 provided in the first layer M1 may correspond to the fourth electrodes 140 of the second layer M2. For example, the fourth electrodes 140 of the second layer M2 may be arranged such that the branch portions 112 of the first electrodes 110 provided in the first layer M1 may be aligned with the fourth electrodes 140 in the vertical direction (for example, the z-axis direction). In addition, the first electrodes 110 and the third electrodes 130 may be electrically connected to each other through the first contact elements 151 provided on the base portions 111 of the first electrodes 110.

The branch portions 122 of the second electrodes 120 provided in the first layer M1 may correspond to the third electrodes 130 of the second layer M2. For example, the third electrodes 130 of the second layer M2 may be arranged such that the branch portions 122 of the second electrodes 120 provided in the first layer M1 may be aligned with the third electrodes 130 in the vertical direction. In addition, the second electrodes 120 and the fourth electrodes 140 may be electrically connected to each other through the second contact elements 152 provided on the base portions 121 of the second electrodes 120.

A plurality of contact elements 151 and 152 may be provided on the second layer M2. For example, one or more first contact elements 151 may be provided on the third electrodes 130 at positions corresponding to the base portions 111 of the first electrodes 110 of the first layer M1. The first contact elements 151 provided on the second layer M2 are for electrically connecting the third electrodes 130 to first electrodes 110 of the third layer M3 (which is identical to the first layer M1) provided above the second layer M2.

One or more second contact elements 152 may be provided on the third electrodes 130 at positions corresponding to the base portions 121 of the second electrodes 120 of the first layer M1. The second contact elements 152 provided on the second layer M2 are for electrically connecting the fourth electrodes 140 to second electrodes 120 of the third layer M3 (which is identical to the first layer M1) provided above the second layer M2.

The third layer M3 identical to the first layer M1 is placed above the second layer M2, and the fourth layer M4 identical to the second layer M2 is placed above the third layer M3. In addition, the fifth layer M5 identical to the first layer M1 is placed above the fourth layer M4.

Figure 4A:
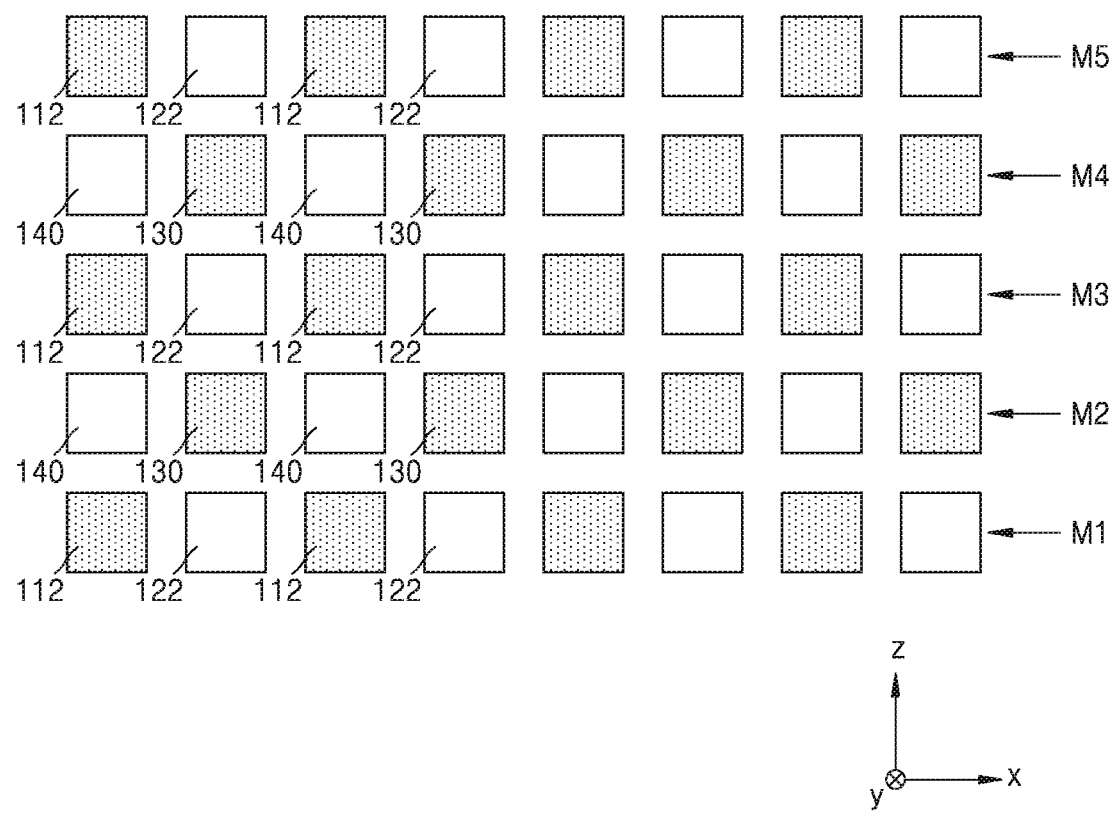
FIG. 4A is a cross-sectional view taken along line I-I' of FIG. 1.

FIG. 4A is a cross-sectional view taken along line I-I' of the capacitor structure 100 shown in FIG. 1.

Referring to FIG. 4A, the branch portions 112 of the first electrodes 110 and the branch portions 122 of the second electrodes 120 are alternately arranged in the second direction (for example, the x-axis direction), and the third electrodes 130 and the fourth electrodes 140 are alternately arranged in the second direction (for example, the x-axis direction). The branch portions 112 of the first electrodes 110 and the fourth electrodes 140 are alternately arranged in the vertical direction (for example, the z-axis direction), and the branch portions 122 of the second electrodes 120 and the third electrodes 130 are alternately arranged in the vertical direction (for example, the z-axis direction).

As described above, different voltages are applied to the first and second electrodes 110 and 120, and different voltages are applied to the third and fourth electrodes 130 and 140. In addition, because the same voltage is applied to the first and third electrodes 110 and 130, different voltages are applied to the first and fourth electrodes 110 and 140, and because the same voltage is applied to the second and fourth electrodes 120 and 140, different voltages are applied to the second and third electrodes 120 and 130.

The branch portions 112 of the first electrodes 110 may be capacitively coupled to the branch portions 122 of the second electrodes 120 in the horizontal direction of the first layer M1, and may also be capacitively coupled to the fourth electrodes 140 in the vertical direction of the first layer M1. In addition, the branch portions 122 of the second electrodes 120 may be capacitively coupled to the branch portions 112 of the first electrodes 110 in the horizontal direction of the first layer M1, and may also be capacitively coupled to the third electrodes 130 in the vertical direction of the first electrode M1. As a result, capacitive coupling areas may be increased.

Figure 4B:
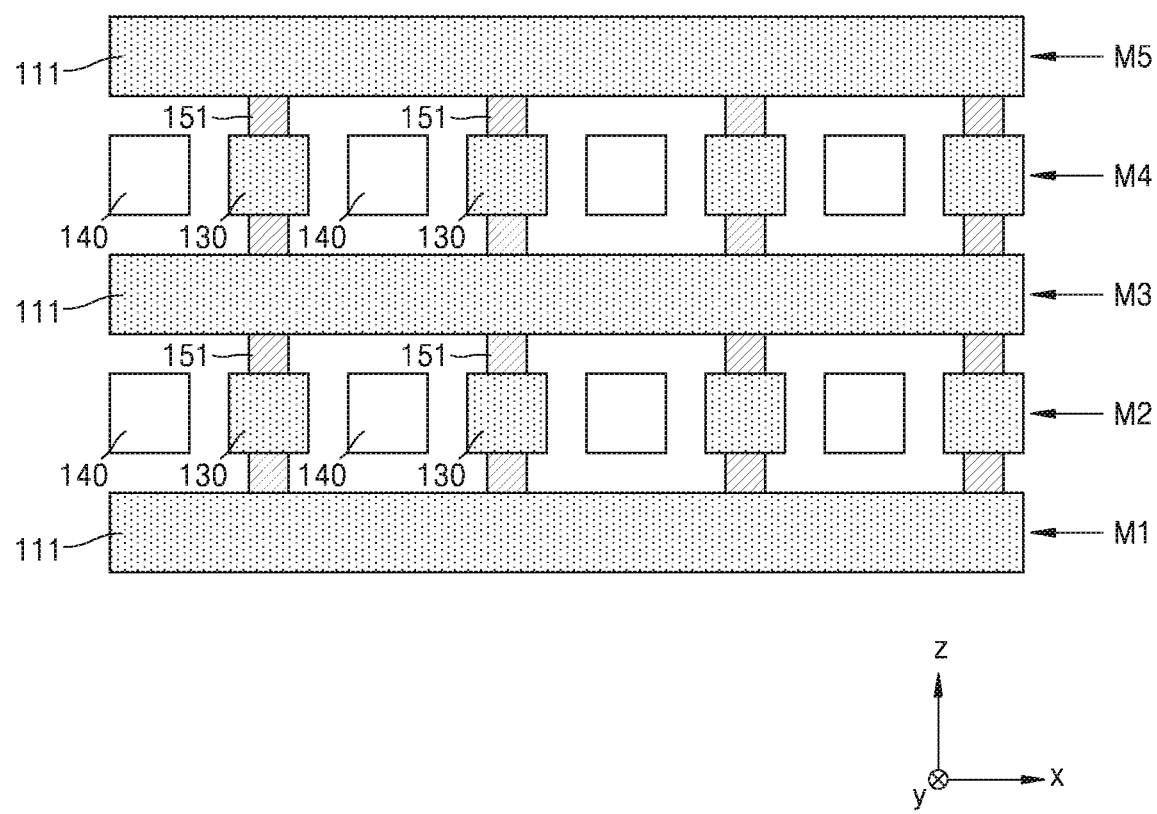
FIG. 4B is a cross-sectional view taken along line II-II' of FIG. 1.

FIG. 4B is a cross-sectional view taken along line II-II' of the capacitor structure 100 shown in FIG. 1.

Referring to FIG. 4B, the third electrodes 130 and the fourth electrodes 140 are alternately arranged in the second direction (for example, the x-axis direction). In addition, the base portions 111 of the first electrodes 110 and the fourth electrodes 140 are alternately arranged in the vertical direction (for example, the z-axis direction). Although not shown in FIG. 4B, the base portions 121 of the second electrodes 120 and the third electrodes 130 are alternately arranged in the vertical direction (for example, the z-axis direction).

The base portions 111 of the first electrodes 110 may be capacitively coupled to the branch portions 122 of the second electrodes 120 in the horizontal direction of the first layer M1, and may also be capacitively coupled to the fourth electrodes 140 in the vertical direction of the first layer M1. In addition, the base portions 121 of the second electrodes 120 may be capacitively coupled to the branch portions 112 of the first electrodes 110 in the horizontal direction of the first layer M1, and may also be capacitively coupled to the third electrodes 130 in the vertical direction of the first electrode M1. Therefore, capacitive coupling is formed between the base portions 111 of the first electrodes 110 and the fourth electrodes 140 and between the base portions 121 of the second electrodes 120 and the third electrodes 130, and thus capacitive coupling areas may be increased.

In the above, the example in which three first layers M1 and two second layers M2 are alternately stacked has been described. However, the disclosure is not limited thereto. For example, three second layers M2 and two first layers M1 may be alternately stacked. In addition, although the example in which five layers are stacked has been described above, the number of layers of the capacitor structure 100 may be variously selected.

Figure 5A:
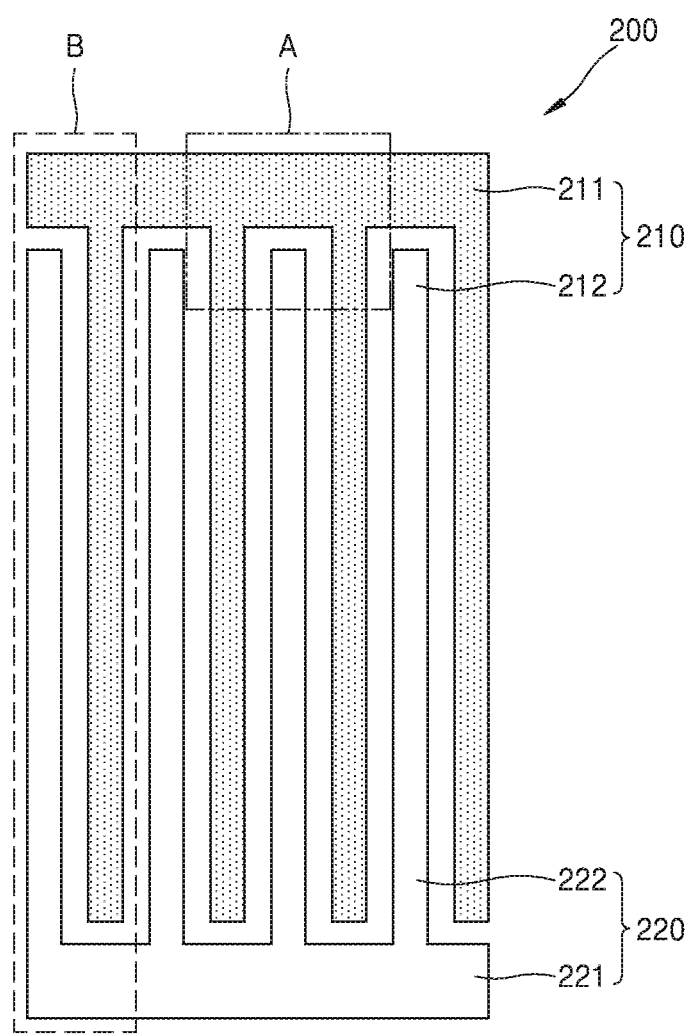
FIG. 5A is a plan view illustrating a capacitor structure of the related art.

FIG. 5A is a plan view illustrating a capacitor structure 200 of the related art.

Referring to FIG. 5A, the capacitor structure 200 of the related art includes a stack of a plurality of layers having the same shape, and each of the plurality of layers includes first and second electrodes 210 and 220. The first electrode 210 includes a base portion 211 and a plurality of branch portions 212 protruding from the base portion 211, and the second electrode 220 includes a base portion 221 and a plurality of branch portions 222 protruding from the base portion 221. Here, the branch portions 212 of the first electrode 210 and the branch portions 222 of the second electrode 220 are alternately arranged.

In FIG. 5A, a region B refers to a region that normally operates even when a region A is damaged. As shown in FIG. 5A, in the capacitor structure 200 of the related art, when the region A is damaged, only the region B normally operates, and thus overall capacitance may be markedly reduced.

Figure 5B:
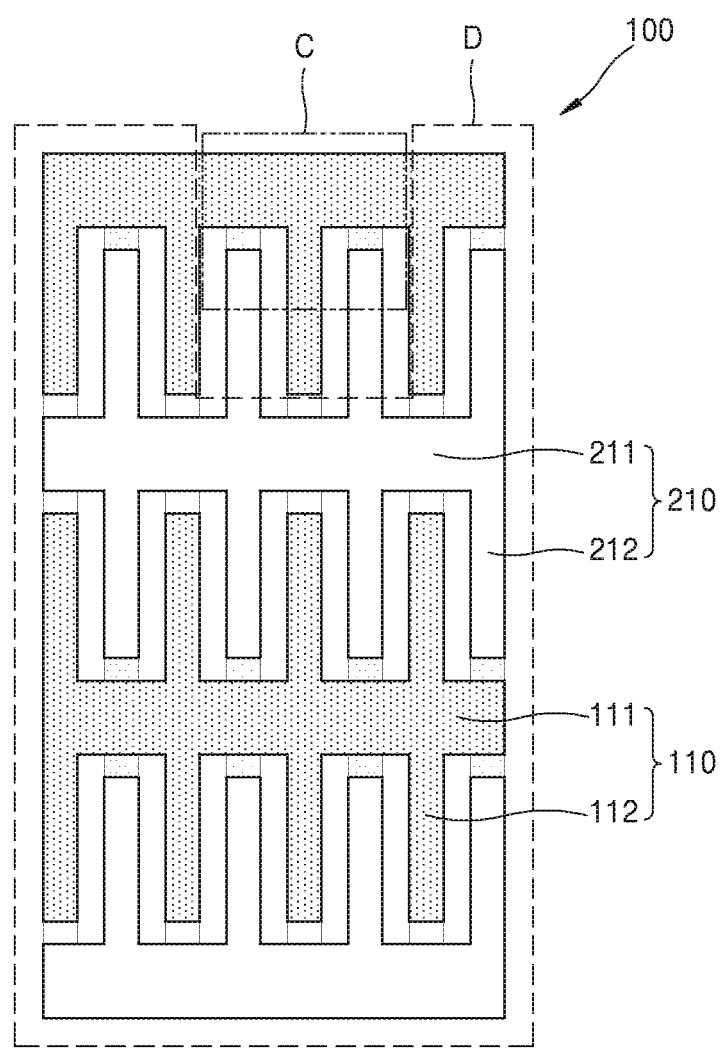
FIG. 5B is a plan view illustrating a capacitor structure according to embodiments.

FIG. 5B is a plan view illustrating the capacitor structure 100 according to embodiments.

Referring to FIG. 5B, the capacitor structure 100 of the embodiments includes at least one first layer M1 (refer to FIG. 1) and at least one second layer M2 (refer to FIG. 1) that are alternately stacked. Because the capacitor structure 100 has been described above, a detailed description thereof will not be repeated here. The first layer M1 includes first and second electrodes 110 and 210 alternately arranged in a first direction, and the second layer M2 includes third and fourth electrodes 130 and 140 alternately arranged in a second direction. The first and second electrodes 110 and 210 respectively include base portions 111 and 211 and a plurality of branch portions 112 and 212 protruding from the base portions 111 and 211. Here, the branch portions 112 of the first electrodes 110 and the branch portions 212 of the second electrodes 210 are alternately arranged. In addition, the third and fourth electrodes 130 and 140 have line shapes parallel to each other.

In FIG. 5B, a region D refers to a region that normally operates even when a region C is damaged. As shown in FIG. 5B, in the capacitor structure 100 of the embodiments, even when the region C is damaged, the region D occupying most of the area of the capacitor structure 100 may normally operate, and thus the total capacitance of the capacitor structure 100 may not be significantly affected. As described above, the capacitor structure 100 of the embodiments is sturdy such that the total capacitance of the capacitor structure 100 may not be significantly affected even when some regions of the capacitor structure 100 are damaged.

The capacitor structure 200 of the related art shown in FIG. 5A and the capacitor structure 100 of the embodiments shown in FIG. 5B were fabricated to have the same area (1.9×12.9 μm$^2$), and capacitance values thereof were measured by simulation. Both the capacitor structures 200 and 100 had the same electrode widths and intervals and a five-layer structure.

The capacitance value of the capacitor structure 200 of the related art shown in FIG. 5A was approximately 31.75 femto Farad (fF), and the capacitance value of the capacitor structure 100 of the embodiments shown in FIG. 5B was approximately 39.38 fF. That is, the capacitor structure 100 of the embodiments is improved in capacitance by about 24% compared to the capacitor structure 200 of the related art.

The capacitance of the capacitor structure 200 of the related art shown in FIG. 5A was measured to be 31.75 fF and 13.61 fF respectively before and after the region A was damaged. That is, the capacitance of the capacitor structure 200 was decreased by about 57%. However, the capacitance of the capacitor structure 100 of the embodiments shown in FIG. 5B was measured to be 39.38 fF and 37.39 fF respectively before and after the region C was damaged. That is, the capacitance of the capacitor structure 100 was decreased by only about 5%. As described above, the capacitor structure 100 of the embodiments is sturdy such that the total capacitance of the capacitor structure 100 may not be significantly varied even when some regions of the capacitor structure 100 are damaged.

In the capacitor structure 200 of the related art, a plurality of layers having the same shape are stacked. Thus, capacitor structure 200 has low capacitance per unit area, and if the area of the capacitor structure 200 is increased to obtain high capacitance, the manufacturing costs and intrinsic resistance of the capacitor structure 200 may increase. In addition, because electrical connectivity between the electrodes of the capacitor structure 200 and external lines is low, an additional area may be for routing, and thus costs may be increased. In addition, when a portion of the capacitor structure 200 is damaged, the total capacitance of the capacitor structure 200 may be markedly decreased.

However, in the capacitor structure 100 of the embodiments, the first electrodes 110 may be capacitively coupled to the second electrodes 120 in the horizontal direction and the fourth electrodes 140 in the vertical direction. In addition, the second electrodes 120 may be capacitively coupled to the first electrodes 110 in the horizontal direction and the third electrodes 130 in the vertical direction. In addition, capacitive coupling may be formed between the base portions 111 of the first electrodes 110 and the fourth electrodes 140 and between the base portions 121 of the second electrodes 120 and the third electrodes 130. As described above, capacitive coupling areas of the capacitor structure 100 may be increased, and thus the capacitor structure 100 may have high capacitance per unit area and may be provided in a small area of an integrated circuit to realize a high degree of integration.

In addition, electrical connectivity between the electrodes of the capacitor structure 100 and external lines may be improved to reduce areas for routing, increase integration efficiency, and decrease costs and intrinsic resistance. In addition, the capacitor structure 100 is sturdy such that the total capacitance of the capacitor structure 100 may not be significantly decreased even when a portion of the capacitor structure 100 is damaged.

FIG. 6 is a plan view illustrating a capacitor structure 300 according to embodiments.

Referring to FIG. 6, the capacitor structure 300 includes at least one first layer M1 and at least one second layer M2 alternately stacked in a vertical direction (for example, a z-axis direction). FIG. 6 illustrates plan views of first to third layers M1, M2, and M3 that are sequentially stacked in the z-axis direction. Here, the third layer M3 is identical to the first layer M1, and thus it may be considered that two first layers M1 and one second layer M2 are alternately stacked in the z-axis direction in FIG. 6.

The first layer M1 may include at least one first electrode 310, at least one second electrode 320, at least one third electrode 330, and at least one fourth electrode 340 that are periodically arranged in a first direction (for example, a y-axis direction). In the example shown in FIG. 6, first electrodes 310 are respectively provided in edge portions of both sides of the first layer M1, and the second, third, and fourth electrodes 320, 330, and 340 are provided in a center portion of the first layer M1. However, the numbers of first, second, third, and fourth electrodes 310, 320, 330, and 340 provided in the first layer M1 may be variously selected. Here, different voltages may be applied to the first, second, third, and fourth electrodes 310, 320, 330, and 340. The first, second, third, and fourth electrodes 310, 320, 330, and 340 may include a metallic material having high conductivity.

The first, second, third, and fourth electrodes 310, 320, 330, and 340 may respectively include: base portions 311, 321, 331 and 341; and a plurality of branch portions 312, 322, 332, and 342 protruding from the base portions 311, 321, 331 and 341. The base portions 311, 321, 331, and 341 may extend in a second direction (for example, an x-axis direction) perpendicular to the first direction (for example, the y-axis direction), and the plurality of branch portions 312, 322, 332, and 342 may protrude from the base portions 311, 321, 331, and 341 in the first direction. Here, the plurality of branch portions 312, 322, 332, and 342 may be arranged side by side and spaced apart from each other in the second direction. Here, the branch portions 312, 322, 332, and 342 of the first, second, third, and fourth electrodes 310, 320, 330, and 340 may be arranged in such a manner that branch portions of an electrode are arranged between branch portions of an adjacent electrode.

A plurality of contact elements 351, 352, 353, and 354 may be provided on the first layer M1. For example, first, second, third, and fourth contact elements 351, 352, 353, and 354 may be provided on the first, second, third, and fourth electrodes 310, 320, 330, and 340, respectively. The first contact elements 351 may electrically connect the first electrodes 310 of the first layer M1 to fifth electrodes 350 of the second layer M2 and may be provided on the base portions 311 of the first electrodes 310. The second contact elements 352 may electrically connect the second electrode 320 of the first layer M1 to sixth electrodes 360 of the second layer M2 and may be provided on the base portion 321 of the second electrode 320.

The third contact elements 353 may electrically connect the third electrode 330 of the first layer M1 to seventh electrodes 370 of the second layer M2 and may be provided on the base portion 331 of the third electrode 330. The fourth contact elements 354 may electrically connect the fourth electrode 340 of the first layer M1 to eighth electrodes 380 of the second layer M2 and may be provided on the base portion 341 of the fourth electrode 340.

The second layer M2 may include one or more fifth electrodes 350, one or more sixth electrodes 360, one or more seventh electrodes 370, and one or more eighth electrodes 380 that are alternately arranged in the second first direction (for example, the x-axis direction). Different voltages may be applied to the fifth, sixth, seventh, and eighth electrodes 350, 360, 370, and 380.

The fifth electrodes 350 may be electrically connected to the first electrodes 310 through the first contact elements 351 such that the same voltage may be applied to the fifth electrodes 350 and the first electrodes 310. The sixth electrodes 360 may be electrically connected to the second electrode 320 through the second contact elements 352 such that the same voltage may be applied to the sixth electrodes 360 and the second electrode 320. The seventh electrodes 370 may be electrically connected to the third electrodes 330 through the third contact elements 353 such that the same voltage may be applied to the seventh electrodes 370 and the third electrode 330. The eighth electrodes 380 may be electrically connected to the fourth electrode 340 through the fourth contact elements 354 such that the same voltage may be applied to the eighth electrodes 380 and the fourth electrode 340.

FIG. 6 illustrates an example in which two fifth electrodes 350, two sixth electrodes 360, two seventh electrodes 370, and two eighth electrodes 380 are periodically arranged in the second layer M2 in the x-axis direction. However, this is a non-limiting example. That is, the numbers of fifth, sixth, seventh, and eighth electrodes 350, 360, 370, and 380 provided in the second layer M2 may be variously selected. The fifth, sixth, seventh, and eighth electrodes 350, 360, 370, and 380 may include a metallic material having high conductivity. Here, each of the fifth, sixth, seventh, and eighth electrodes 350, 360, 370, and 380 may have a line shape extending in the first direction (for example, the y-axis direction), and the fifth, sixth, seventh, and eighth electrodes 350, 360, 370, and 380 having a line shape may be arranged side by side.

The fifth electrodes 350 of the second layer M2 may correspond to branch portions 322 and 342 of the second and fourth electrodes 320 and 340 provided in the first layer M1. For example, the fifth electrodes 350 of the second layer M2 may be arranged such that the branch portions 322 and 342 of the second and fourth electrodes 320 and 340 provided in the first layer M1 may be aligned with the fifth electrodes 350 in the vertical direction (for example, the z-axis direction). Here, the first electrodes 310 and the fifth electrodes 350 may be electrically connected to each other through the first contact elements 351 provided on the base portions 311 of the first electrodes 310.

The sixth electrodes 360 of the second layer M2 may correspond to branch portions 312 and 322 of the first and third electrodes 310 and 330 provided in the first layer M1. For example, the sixth electrodes 360 of the second layer M2 may be arranged such that the branch portions 312 and 332 of the first and third electrodes 310 and 330 provided in the first layer M1 may be aligned with the sixth electrodes 360 in the vertical direction. Here, the second electrode 320 and the sixth electrodes 360 may be electrically connected to each other through the second contact elements 352 provided on the base portion 321 of the second electrode 320.

The seventh electrodes 370 of the second layer M2 may correspond to branch portions 322 and 342 of the second and fourth electrodes 320 and 340 provided in the first layer M1. For example, the seventh electrodes 370 of the second layer M2 may be arranged such that the branch portions 322 and 342 of the second and fourth electrodes 320 and 340 provided in the first layer M1 may be aligned with the seventh electrodes 370 in the vertical direction. Here, the third electrode 330 and the seventh electrodes 370 may be electrically connected to each other through the third contact elements 353 provided on the base portion 331 of the third electrode 330.

The eighth electrodes 380 of the second layer M2 may correspond to branch portions 312 and 322 of the first and third electrodes 310 and 330 provided in the first layer M1. For example, the eighth electrodes 380 of the second layer M2 may be arranged such that the branch portions 312 and 332 of the first and third electrodes 310 and 330 provided in the first layer M1 may be aligned with the eighth electrodes 380 in the vertical direction. Here, the fourth electrode 340 and the eighth electrodes 380 may be electrically connected to each other through the fourth contact elements 354 provided on the base portion 341 of the fourth electrode 340.

A plurality of contact elements 351, 352, 353, and 354 may be provided on the second layer M2. For example, one or more first contact elements 351 may be provided on the fifth electrodes 350 at positions corresponding to the base portions 311 of the first electrodes 310 of the first layer M1. The first contact elements 351 provided on the second layer M2 are for electrically connecting the fifth electrodes 350 to first electrodes 310 of the third layer M3 (which is identical to the first layer M1) provided above the second layer M2.

One or more second contact elements 352 may be provided on the sixth electrodes 360 at positions corresponding to the base portion 321 of the second electrode 320 of the first layer M1. The second contact elements 352 provided on the second layer M2 are for electrically connecting the sixth electrodes 360 to a second electrode 320 of the third layer M3 (which is identical to the first layer M1) provided above the second layer M2.

One or more third contact elements 353 may be provided on the seventh electrodes 370 at positions corresponding to the base portion 331 of the third electrode 330 of the first layer M1. The third contact elements 353 provided on the second layer M2 are for electrically connecting the seventh electrodes 370 to a third electrode 330 of the third layer M3 (which is identical to the first layer M1) provided above the second layer M2. One or more fourth contact elements 354 may be provided on the eighth electrodes 380 at positions corresponding to the base portion 341 of the fourth electrode 340 of the first layer M1. The fourth contact elements 354 provided on the second layer M2 are for electrically connecting the eighth electrodes 380 to a fourth electrode 340 of the third layer M3 (which is identical to the first layer M1) provided above the second layer M2. The third layer M3 identical to the first layer M1 is placed above the second layer M2.

In the capacitor structure 300, for example, the second electrode 320 of the first layer M1 may be capacitively coupled to the first and third electrodes 310 and 330 of the first layer M1 and may also be capacitively coupled to the fifth, seventh, and eighth electrodes 350, 370, and 380 of the second layer M2, and thus a plurality of capacitive couplings may be formed. In addition, the capacitor structure 300 of the embodiments may be easily provided by adjusting the positions of the contact elements 151 and 152 in the capacitor structure 100 of the previous embodiment.

Although the capacitor structure 300 having a three-layer structure in which two first layers M1 and one second layer M2 are alternately stacked has been described above, the embodiments are not limited thereto. That is, the numbers of first and second layers M1 and M2 may be variously selected.

Figure 7:
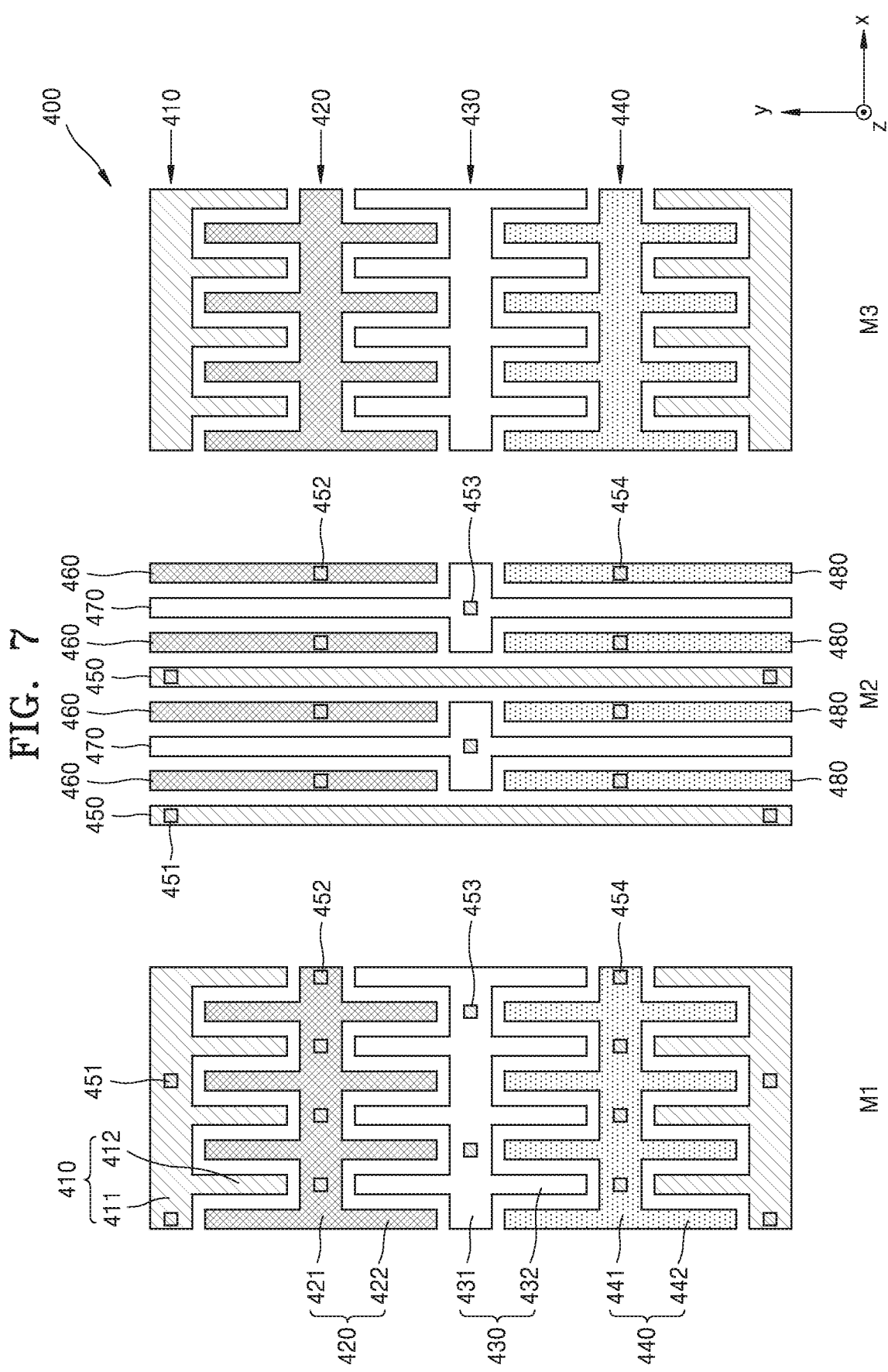
FIG. 7 is a plan view illustrating a capacitor structure according to embodiments.

FIG. 7 is a plan view illustrating a capacitor structure 400 according to embodiments.

Referring to FIG. 7, the capacitor structure 400 includes at least one first layer M1 and at least one second layer M2 alternately stacked in a vertical direction (for example, a z-axis direction). FIG. 7 illustrates plan views of first to third layers M1, M2, and M3 that are sequentially stacked in the z-axis direction. Here, the third layer M3 is identical to the first layer M1, and thus it may be considered that two first layers M1 and one second layer M2 are alternately stacked in the z direction in FIG. 7.

The first layer M1 may include at least one first electrode 410, at least one second electrode 420, at least one third electrode 430, and at least one fourth electrode 440 that are periodically arranged in a first direction (for example, a y-axis direction). In the example shown in FIG. 7, first electrodes 410 are respectively provided in edge portions of both sides of the first layer M1, and the second, third, and fourth electrodes 420, 430, and 440 are provided in a center portion of the first layer M1. Different voltages may be applied to the first, second, third, and fourth electrodes 410, 420, 430, and 440.

The first, second, third, and fourth electrodes 410, 420, 430, and 440 may respectively include: base portions 411, 421, 431 and 441; and a plurality of branch portions 412, 422, 432, and 442 protruding from the base portions 411, 421, 431 and 441. The base portions 411, 421, 431, and 441 may extend in a second direction (for example, an x-axis direction) perpendicular to the first direction (for example, the y-axis direction), and the plurality of branch portions 412, 422, 432, and 442 may protrude from the base portions 411, 421, 431, and 441 in the first direction. Here, the plurality of branch portions 412, 422, 432, and 442 may be arranged side by side and spaced apart from each other in the second direction. The plurality of branch portions 412, 422, 432, and 442 of the first, second, third, and fourth electrodes 410, 420, 430, and 440 may be arranged in such a manner that branch portions of an electrode are placed between branch portions of an adjacent electrode.

A plurality of contact elements 451, 452, 453, and 454 may be provided on the first layer M1. For example, first, second, third, and fourth contact elements 451, 452, 453, and 454 may be provided on the first, second, third, and fourth electrodes 410, 420, 430 and 440, respectively. The first contact elements 451 may electrically connect the first electrodes 410 of the first layer M1 to fifth electrodes 450 of the second layer M2 and may be provided on the base portions 411 of the first electrodes 410. The second contact elements 452 may electrically connect the second electrode 420 of the first layer M1 to sixth electrodes 460 of the second layer M2 and may be provided on the base portion 421 of the second electrode 420.

The third contact elements 453 may electrically connect the third electrode 430 of the first layer M1 to seventh electrodes 470 of the second layer M2 and may be provided on the base portion 431 of the third electrode 430. The fourth contact elements 454 may electrically connect the fourth electrode 440 of the first layer M1 to eighth electrodes 480 of the second layer M2 and may be provided on the base portion 441 of the fourth electrode 440.

The second layer M2 may include one or more fifth electrodes 450, one or more sixth electrodes 460, one or more seventh electrodes 470, and one or more eighth electrodes 480 that are arranged in the second first direction (for example, the x-axis direction). Different voltages may be applied to the fifth, sixth, seventh, and eighth electrodes 450, 460, 470, and 480.

The fifth electrodes 450 may be electrically connected to the first electrodes 410 through the first contact elements 451 such that the same voltage may be applied to the fifth electrodes 450 and the first electrodes 410. The sixth electrodes 460 may be electrically connected to the second electrode 420 through the second contact elements 452 such that the same voltage may be applied to the sixth electrodes 460 and the second electrode 420. The seventh electrodes 470 may be electrically connected to the third electrode 430 through the third contact elements 453 such that the same voltage may be applied to the seventh electrodes 470 and the third electrode 430. The eighth electrodes 480 may be electrically connected to the fourth electrode 440 through the fourth contact elements 454 such that the same voltage may be applied to the eighth electrodes 480 and the fourth electrode 440.

The fifth and seventh electrodes 450 and 470 may have a line shape extending in the first direction (for example, the y-axis direction). In addition, the sixth electrodes 460 may be arranged in a line shape in a region corresponding to a region in which the first and second electrodes 410 and 420 of the first layer M1 are provided, and the eighth electrode 480 may be arranged in a line shape in a region corresponding to a region in which the first and fourth electrodes 410 and 440 of the first layer M1 are provided. The fifth, sixth, seventh, and eighth electrodes 450, 460, 470, and 480 of the second layer M2 may correspond to the branch portions 412, 422, 432, and 442 of the first, second, third, and fourth electrodes 410, 420, 430, and 440 of the first layer M1.

A plurality of contact elements 451, 452, 453, and 454 may be provided on the second layer M2. For example, one or more first contact elements 451 may be provided on the fifth electrode 450 at positions corresponding to the base portions 411 of the first electrodes 410 of the first layer M1. One or more second contact elements 452 may be provided on the sixth electrode 460 at positions corresponding to the base portion 421 of the second electrode 420 of the first layer M1.

One or more seventh contact elements 453 may be provided on the sixth electrode 470 at positions corresponding to the base portion 431 of the third electrode 430 of the first layer M1. One or more eighth contact elements 454 may be provided on the eighth electrode 480 at positions corresponding to the base portion 441 of the fourth electrode 440 of the first layer M1. The third layer M3 identical to the first layer M1 is placed above the second layer M2.

In the capacitor structure 400, for example, the second electrode 420 of the first layer M1 may be capacitively coupled to the first and third electrodes 410 and 430 of the first layer M1 and may also be capacitively coupled to the fifth and seventh electrodes 450 and 470 of the second layer M2, and thus a plurality of capacitive couplings may be formed. However, the second electrode 420 is capacitively isolated from the fourth and eighth electrodes 440 and 480 without forming a capacitive coupling. In this manner, the degree of coupling may be adjusted by enhancing coupling between some electrodes and forming no coupling between the other electrodes. Although the capacitor structure 400 having a three-layer structure in which two first layers M1 and one second layer M2 are alternately stacked has been described above, the embodiments are not limited thereto. That is, the numbers of first and second layers M1 and M2 may be variously selected.

FIG. 8 is a plan view illustrating a capacitor structure 500 according to embodiments.

Referring to FIG. 8, the capacitor structure 500 includes: first and second plate electrodes P1 and P2 spaced apart from each other in a vertical direction (for example, a z-axis direction); and at least one first layer M1 and at least one second layer M2 that are alternately stacked in the vertical direction between the first and second plate electrodes P1 and P2. FIG. 8 illustrates plan views of the first plate electrode P1, first, second, and third layers M1, M2, and M3, and the second plate electrode P2 that are sequentially stacked in the z-axis direction. Here, the third layer M3 is identical to the first layer M1. Thus, in FIG. 8, it may be considered that two first layers M1 and one second layer M2 are alternately stacked in the z-axis direction between the first and second plate electrodes P1 and P2.

The first plate electrode P1 covers a lower portion of the first layer M1. The first plate electrode P1 may include a metallic material having high conductivity. One or more first contact elements 551 may be provided on the first plate electrode P1 to electrically connect the first plate electrode P1 to first electrodes 510 of the first layer M1. The first contact elements 551 may be provided at positions corresponding to base portions 511 of the first electrodes 510.

The first layer M1 is provided on the first plate electrode P1. The first layer M1 may include at least one first electrode 510 and at least one second electrode 520 that are alternately arranged in a first direction (for example, a y-axis direction). In this case, first electrodes 510 may be arranged on outer sides of the first layer M1. FIG. 8 illustrates an example in which the first electrodes 510 are located on the outer sides of the first layer M1, and one second electrode 520 is located in an inner region of the first layer M1. The numbers of first and second electrodes 510 and 520 of the first layer M1 may be variously selected. The first and second electrodes 510 and 520 may include a metallic material having high conductivity.

Different voltages may be applied to the first and second electrodes 510 and 520. The first electrodes 510 are electrically connected to the first plate electrode P1 through the first contact elements 551 provided on the first plate electrode P1 such that the same voltage may be applied to the first electrodes 510 and the first plate electrode P1.

The first and second electrodes 510 and 520 may respectively include: base portions 511 and 521; and a plurality of branch portions 512 and 522 protruding from the base portions 511 and 521. The base portions 511 and 521 may extend in a second direction (for example, an x-axis direction) perpendicular to the first direction (for example, the y-axis direction), and the plurality of branch portions 512 and 522 may protrude from the base portions 511 and 512 in the first direction. The plurality of branch portions 512 and 522 may be arranged side by side and spaced apart from each other in the second direction. Here, the plurality of branch portions 522 of the second electrode 520 may be arranged between the branch portions 512 of the first electrodes 510.

A plurality of contact elements 551 and 552 may be provided on the first layer M1. For example, the plurality of contact elements 551 and 552 may include one or more first contact elements 551 provided on the first electrodes 510 and one or more second contact elements 552 provided on the second electrode 520. The first contact elements 551 may electrically connect the first electrodes 510 of the first layer M1 to third electrodes 530 of the second layer M2 and may be provided on the base portions 511 of the first electrodes 510. The second contact elements 552 may electrically connect the second electrode 520 of the first layer M1 to fourth electrodes 540 of the second layer M2 and may be provided on the base portion 521 of the second electrode 520.

The second layer M2 may include one or more third electrodes 530 and one or more fourth electrodes 540 that are alternately arranged in the second direction (for example, the x-axis direction). The third and fourth electrodes 530 and 540 may have a line shape extending in the first direction (for example, the y-axis direction) and may be arranged side by side. In this case, the third electrodes 530 may be arranged on outer sides of the second layer M1. FIG. 8 illustrates an example in which three third electrodes 530 and two fourth electrodes 540 are alternately arranged. The numbers of third and fourth electrodes 530 and 540 may be variously selected. The third and fourth electrodes 530 and 540 may include a metallic material having high conductivity.

Different voltages may be applied to the third and fourth electrodes 530 and 540. The third electrodes 530 may be electrically connected to the first electrodes 510 through the first contact elements 551 such that the same voltage may be applied to the third electrodes 530 and the first electrodes 510. In addition, the fourth electrodes 540 may be electrically connected to the second electrode 520 through the second contact elements 552 such that the same voltage may be applied to the fourth electrodes 540 and the second electrode 520.

The fourth electrodes 540 of the second layer M2 may correspond to branch portions 512 of the first electrodes 510 of the first layer M1. For example, the fourth electrodes 540 of the second layer M2 may be arranged such that the branch portions 512 of the first electrodes 510 of the first layer M1 may be aligned with the fourth electrodes 540 in the vertical direction (for example, the z-axis direction). The first electrodes 510 and the third electrodes 530 may be electrically connected to each other through the first contact elements 551 provided on the base portions 511 of the first electrodes 510.

The third electrodes 530 of the second layer M2 may correspond to the branch portions 522 of the second electrode 520 of the first layer M1. For example, the third electrodes 530 of the second layer M2 may be arranged such that the branch portions 522 of the second electrode 520 of the first layer M1 may be aligned with the third electrodes 530 in the vertical direction. The second electrode 520 and the fourth electrodes 540 may be electrically connected to each other through the second contact elements 552 provided on the base portion 521 of the second electrode 520.

A plurality of contact elements 551 and 552 may be provided on the second layer M2. For example, one or more first contact elements 551 may be provided on the third electrode 530 at positions corresponding to the base portions 511 of the first electrodes 510 of the first layer M1. The first contact elements 551 provided on the second layer M2 are for electrically connecting the third electrodes 530 to first electrodes 510 of the third layer M3 (which is identical to the first layer M1) provided above the second layer M2.

One or more second contact elements 552 may be provided on the fourth electrodes 540 at positions corresponding to the base portion 521 of the second electrode 520 of the first layer M1. The second contact elements 552 provided on the second layer M2 are for electrically connecting the fourth electrodes 540 to a second electrode 520 of the third layer M3 (which is identical to the first layer M1) provided above the second layer M2.

The third layer M3 identical to the first layer M1 is placed above the second layer M2. First contact elements 551 may be provided on the base portions 511 of the first electrodes 510 of the third layer M3, and the first contact elements 551 may electrically connect the first electrodes 510 of the third layer M3 to the second plate electrode P2 provided above the third layer M3. The second plate electrode P2 covers an upper portion of the third layer M3. The second plate electrode P2 may include a metallic material having high conductivity.

In the capacitor structure 500, the first and second plate electrodes P1 and P2 cover the lower and upper portions of the first, second, and third layers M1, M2, and M3, the first electrodes 510 are placed on outer sides of the first and third layers M1 and M3, and the third electrodes 530 are placed on outer sides of the second layer M2. Because the first plate electrode P1, the first electrodes 510, the third electrodes 530, and the second plate electrode P2 are electrically connected to each other through the first contact elements 551, the same voltage may be applied to the first plate electrode P1, the first electrodes 510, the third electrodes 530, and the second plate electrode P2.

As described above, the second and fourth electrodes 520 and 540 placed inside the capacitor structure 500 are surrounded by the first plate electrode P1, the first electrodes 510, the third electrodes 530, and the second plate electrode P2 that are placed on outer sides of the capacitor structure 500 and are electrically connected to each other. Therefore, the second and fourth electrodes 520 and 540 may be prevented from being affected by external noise signals.

In the above description, two first layers M1 and one second layer M2 are alternately stacked between the first and second plate electrodes P1 and P2. However, the numbers of first and second layers M1 and M2 may be variously selected.

The capacitive coupling areas of the capacitor structures of the example embodiments may be increased to increase capacitance per unit area, and the capacitor structures may be provided in small regions of integrated circuits for realizing a high degree of integration. In addition, electrical connectivity between the electrodes of the capacitor structures and external lines may be improved to reduce areas for routing, increase integration efficiency, and decrease costs and intrinsic resistance. In addition, the capacitor structures are sturdy such that the capacitance of the capacitor structures may not be significantly decreased even when some portions of the capacitor structures are damaged. Although embodiments have been described, the embodiments are for illustrative purposes only, and those skilled in the art may make various modifications therefrom.

It may be understood that embodiments described herein may be considered in a descriptive sense only and not for purposes of limitation. Descriptions of features or aspects within each embodiment may be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A capacitor structure comprising:
   a plurality of first layers and at least one second layer that are alternately stacked,
   wherein each first layer of the plurality of first layers comprises first electrodes, second electrodes, third electrodes, and fourth electrodes alternately arranged in a first direction,
   wherein the at least one second layer comprises fifth electrodes, sixth electrodes, seventh electrodes, and eighth electrodes alternately arranged in a second direction intersecting the first direction, the fifth electrodes being electrically connected to the first electrodes, the sixth electrodes being electrically connected to the second electrodes, the seventh electrodes being electrically connected to the third electrodes, and the eighth electrodes being electrically connected to the fourth electrodes,
   wherein each of the first electrodes, the second electrodes, the third electrodes, and the fourth electrodes comprises a base portion and branch portions protruding from the base portion,
   wherein the fifth electrodes, the sixth electrodes, the seventh electrodes, and the eighth electrodes are arranged side by side to correspond to the branch portions of the first electrodes, the second electrodes, the third electrodes, and the fourth electrodes,
   wherein the fifth electrodes have a line shape extending in the first direction,
   wherein the sixth electrodes have a line shape and are arranged in first regions corresponding to second regions in which the first electrodes and the second electrodes are provided,
   wherein the eighth electrodes have a line shape and are arranged in third regions corresponding to fourth regions in which the first electrodes and the fourth electrodes are provided,
   wherein the seventh electrodes have a line shape extending in the first direction, each of the seventh electrodes having a first width in a center region corresponding to the third electrodes and a second width in remaining regions of each of the seventh electrodes, the first width being wider than the second width,
   wherein the at least one second layer is interposed between the plurality of first layers,
   wherein the first electrodes are disposed on outer sides of each first layer of the plurality of first layers, and
   wherein at least one third electrode of the third electrodes is disposed on an outer side of the at least one second layer.

2. The capacitor structure of claim 1, further comprising a first plate electrode and a second plate electrode configured to cover outer sides of the plurality of first layers and is electrically connected to the first electrodes.

3. A capacitor structure comprising:
   at least one first layer and at least one second layer that are alternately stacked,
   wherein the at least one first layer comprises first electrodes arranged in a first direction,
   wherein the at least one second layer comprises second electrodes electrically connected to the first electrodes,
   wherein each of the first electrodes comprises a base portion and branch portions protruding from the base portion,
   wherein the second electrodes correspond to the branch portions,
   wherein a portion of the second electrodes have a line shape extending in the first direction, have a first width in a center region, and have a second width in remaining regions, the first width being wider than the second width,
   wherein the center region of each of the second electrodes is disposed between base portions of the first electrodes,
   wherein at least one of the first electrodes is not physically connected to at least one of the second electrodes, and
   wherein the at least one of the first electrodes is capacitively isolated from the at least one of the second electrodes.

4. The capacitor structure of claim 1, wherein the center region of each of the seventh electrodes is disposed between the sixth electrodes and the eighth electrodes.

* * * * *